United States Patent
Li (10) Patent No.: US 7,519,929 B2
(45) Date of Patent: Apr. 14, 2009

(54) METHOD AND COMPUTER PROGRAM PRODUCT FOR INTERLAYER CONNECTION OF ARBITRARILY COMPLEX SHAPES UNDER ASYMMETRIC VIA ENCLOSURE RULES

(75) Inventor: Mu-Jing Li, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 220 days.

(21) Appl. No.: 11/426,223

(22) Filed: Jun. 23, 2006

(65) Prior Publication Data

US 2007/0300195 A1    Dec. 27, 2007

(51) Int. Cl.
*G06F 17/50* (2006.01)
(52) U.S. Cl. .......................................... 716/5
(58) Field of Classification Search ....... 716/5
See application file for complete search history.

(56) References Cited

U.S. PATENT DOCUMENTS

| | | | | |
|---|---|---|---|---|
| 6,536,023 B1 * | 3/2003 | Mohan et al. | ................ | 716/5 |
| 6,883,149 B2 * | 4/2005 | Li et al. | ................ | 716/4 |
| 2004/0255258 A1 * | 12/2004 | Li | ................ | 716/8 |

* cited by examiner

*Primary Examiner*—Jack Chiang
*Assistant Examiner*—Brandon W Bowers
(74) *Attorney, Agent, or Firm*—Dorsey & Whitney LLP (57) ABSTRACT

In some embodiments, a method is provided for determining a localized region of overlap of first and second features from respective first and second conductive layers, and determining which enclosure rules to apply to vias formed between the first and second features. In a further aspect of the invention, a method may be provided to determine whether to apply symmetric or asymmetric via metal enclosure rules to a feature as a function of the local environment of the feature. In another aspect of the invention, a computer program product is provided to encode instructions for performing such a process.

20 Claims, 8 Drawing Sheets

METHOD AND COMPUTER PROGRAM PRODUCT FOR INTERLAYER CONNECTION OF ARBITRARILY COMPLEX SHAPES UNDER ASYMMETRIC VIA ENCLOSURE RULES

BACKGROUND

1. Field of the Invention

This invention relates to the layout of electronic circuits and more particularly to complex computer aided design layout and placement of vias and via arrays in a design layout of, for example, an integrated circuit (IC) device or printed wiring board (PWB), where the design layout includes arbitrarily complex metal shapes.

2. Description of the Related Art

As computer chip manufacturers seek to pack ever more function into ever less space, design requirements have become more stringent. "Nanometer technology"—so-called because the minimum feature size is measured in nanometers—has become prevalent, bringing with it new design rules.

Among the new design rules are rules for metal enclosures for vias, that is, metal layer-to-metal layer connections, that call for differing amounts of metal enclosure outside the via depending on the location of the via relative to the metal path in which it resides. These rules are known as asymmetric metal enclosure design rules, and are a type of design for manufacturability (DFM) rule. Asymmetric metal enclosure rules require more metal enclosure at the metal path end, while allowing less metal enclosure at the metal path side. More metal enclosure at the path end guarantees that vias will be covered at the metal path end, while less metal enclosure at the metal side allows for straighter and narrower metal paths, which helps reduce the design size, and makes the design easier to fabricate. To profit from these advantages, use of asymmetric metal enclosures is encouraged in nanometer technology designs.

SUMMARY

In some aspects the invention provides a method useful in an electronic circuit design layout having multiple layers, and wherein each layer may have multiple geometries. In some realizations the invention may provide a method for connecting geometries on two distinct layers. In some embodiments the method may provide a way to fill with vias a region where two features, each representing part of a respective geometry on a respective layer, overlap, the filling obeying appropriate design rules which are determined by localizing the region of overlap of the features.

In another aspect of the invention, a method may be provided for determining a localized region of overlap of first and second features from respective first and second conductive layers, and determining which enclosure rules to apply to vias formed between the first and second features. In a further aspect of the invention, a method may be provided to determine whether to apply symmetric or asymmetric via metal enclosure rules to a feature as a function of the local environment of the feature.

In some embodiments, the invention provides a method of determining the wide class of a feature, determining the rule sets available to that object class, determining the width and direction of the feature, and concluding from the feature's class, width, and direction whether asymmetric enclosure rules may be applied.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Integrated circuit processing professionals are often faced with the task of making electrical connections between otherwise isolated layers of metal in multilayer designs. These metal-to-metal interconnections, called vias, may in principle be formed through any number of layers. In the following disclosure, however, only vias between sequentially formed metal layers will be discussed. By limiting the explanation to this common case, the inventive concepts may be more clearly understood, while those skilled in the art will recognize, using the teaching of this disclosure, that the generalization to non-sequential layers could certainly follow, if desired.

Similarly, although it may be useful in a particular application of the invention to define one, many, or no classes of wide metal objects, most examples will deal with at most three classes: normal, wide and wide1 denoted w0, w1, and w2 respectively. U.S. Pat. No. 6,871,332 issued Mar. 22, 2005 to Li and Yang, incorporated by reference herein in its entirety, provides a deeper discussion of the definition and use of wide class objects to supplement the instant disclosure.

Via formation is often a difficult part of integrated circuit manufacturing because it involves essentially making a precisely located hole in an isolation layer, filling it with conductor, and then topping it with an equally precisely located covering layer with each operation involving its own opportunities for unwanted variances. In summary, reliably manufacturing vias with desired electrical characteristics depends on several factors, including (among others) the width of the metal lines to be connected, the metal layers to be connected, and minimum feature sizes. These considerations are generally consolidated into a set of design rules that can be used by layout designers and programmed into the tools they use to lay out integrated circuits.

Among design rules used for nanometer technology are rules governing placement of vias with respect to each other and the respective metal features they are intended to connect. To ensure reliable manufacturing, design rules require that vias be surrounded by metal enclosures, that is, that metal extend on each side of the via to a minimum width depending on the width of the metal line (the wide metal characteristics). Symmetric metal enclosures provide the same width of metal on all sides of a via, but asymmetric enclosures have more metal enclosure at the metal path end, while allowing less metal enclosure at the metal path side. Implicit in asymmetric enclosure rules is the assumption that the metal path is rectangular and relatively narrow, with a length-to-width ratio greater than 1.

Figure 1:
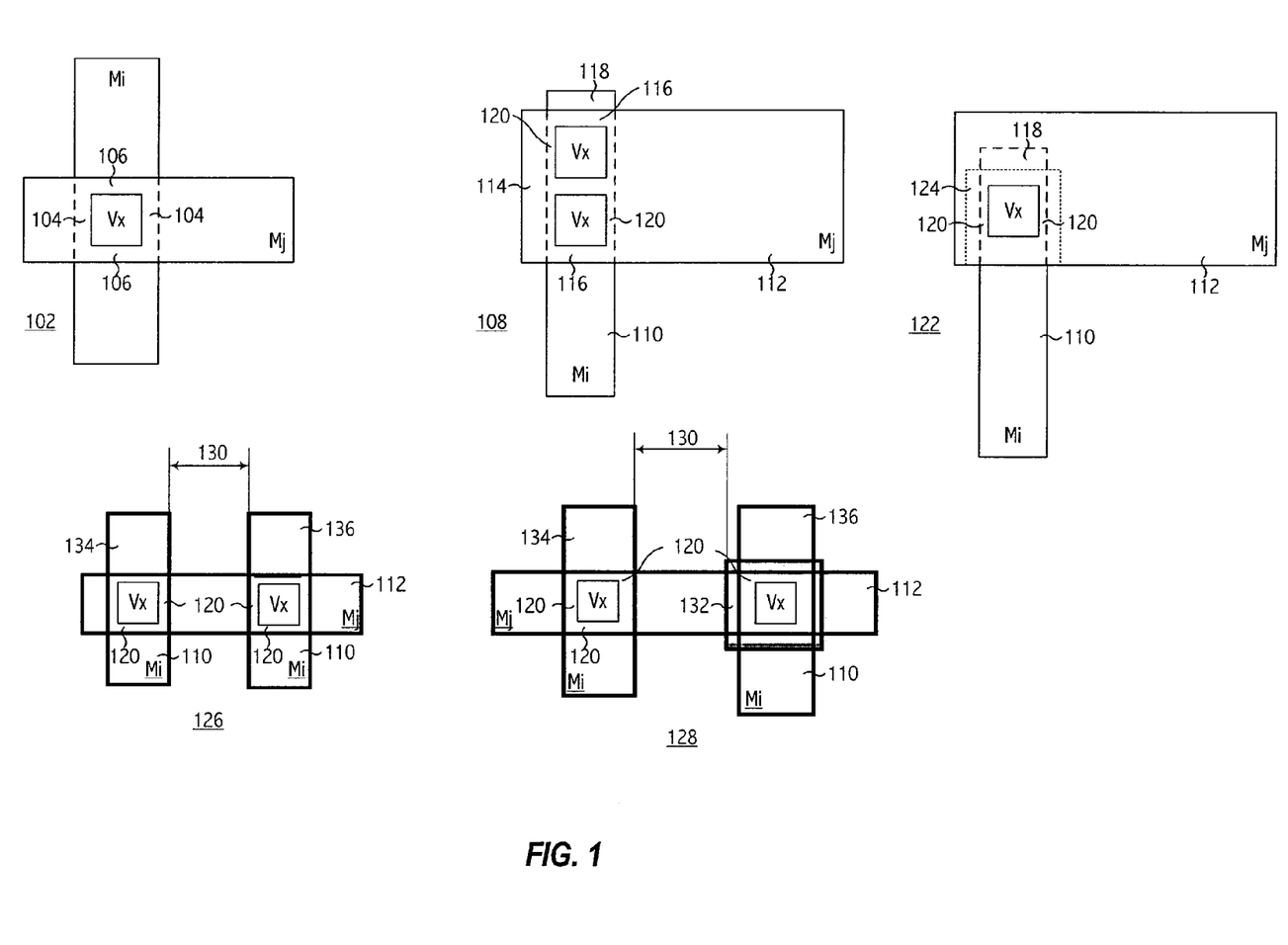
FIG. 1 illustrates some examples of placement of vias connecting two conductive layers as constrained by different design rules.

FIG. 1 illustrates some examples of placement of vias connecting two metal layers as constrained by different design rules. In example 102 a normal symmetric enclosure case is depicted. The metal features Mi on layer i and Mj on layer j both have widths in the range for the normal object class w0 for their respective layers and the width of the enclosure 104 on layer i and 106 on layer j is the same on all sides of the via Vx. Example 108 illustrates asymmetric enclosure cases for both normal 110 and wide metal 112 objects. Here metal feature Mi on layer i is a normal metal 110 object and Mj on layer j is a wide class 112 object. Vias Vx are enclosed on layer j by the wide metal end enclosure 114 and one wide metal side enclosure 116 on each side. On layer i they are enclosed by the normal end enclosure 118 and two normal side enclosures 120. In a real design, design rules can be combined differently, as shown in example via 122. Here layer j has a wide symmetric enclosure 124 and layer i has a normal asymmetric enclosure with end 118 and side 120 enclosures of differing widths.

An advantage of the asymmetric design rule is that, by using more metal enclosure at the end to guarantee that vias will be covered at the metal path end, less metal enclosure may be used at the side. This in turn allows straighter and narrower metal paths, as seen by comparing metal paths 134 and 136 in views 126 and 128, which helps reduce the design size and makes the design easier to fabricate. In the pair shown in view 126, use of asymmetric enclosures 120 on both layers results in straight metal paths, spaced apart by the minimum metal-to-metal distance 130 for that layer. In the case of pair 128 the same metal paths 134 and 136 have had symmetric enclosure rules, requiring enclosure amount 132, imposed on one of the vias. This creates not only a jog on the affected path 136, but it also requires that other paths, e.g. 134, be separated from it by an additional distance since the minimum spacing 130 is no longer measured between the original paths but between the external edge of the enclosure and the other paths. The result is a larger overall design.

Despite the desirability of using asymmetric enclosure rules, manufacturing realities do not always permit it. Each metal layer may have its own processing requirements leading to sets of design rules for each layer, some of which may be the same for several layers and some of which may be unique to each layer. FIGS. 2 through 11 illustrate some relationships between feature sizes on an exemplary metal layer "x." The width of metal lines on layer x are designated "Mx" and may vary (by units of a "grid") from a minimum size "MxWidth" to very large sizes relative to the minimum width, in some cases perhaps more than ten to twenty times the minimum width. Given this, and following customary practice in the art, FIGS. 2 through 11 are not drawn to scale, but instead illustrate possible ordering of feature sizes. Usually more restrictions are placed on the sizes of vias, the electrical connections between metal on different layers, than on the width of metal, so our examples depict vias of a single width, "VxWidth." To ensure reliable manufacturing, design rules require that vias be surrounded by metal enclosures, that is, that metal extend on each side of the via to a minimum width depending on the width of the metal line (the wide metal characteristics). In FIGS. 2 through 11 the metal enclosures bear names ending in "OverVx."

Figure 2:
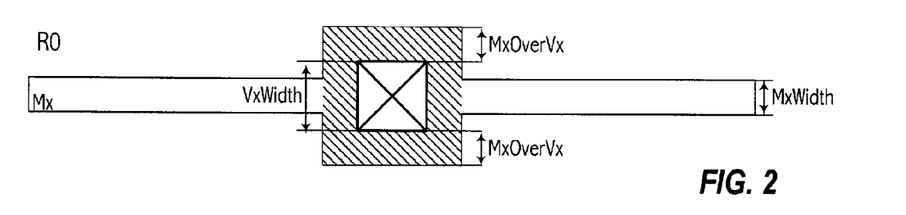
FIGS. 2 through 11 depict metal paths of various widths and possible via placements therein.
Figure 3:
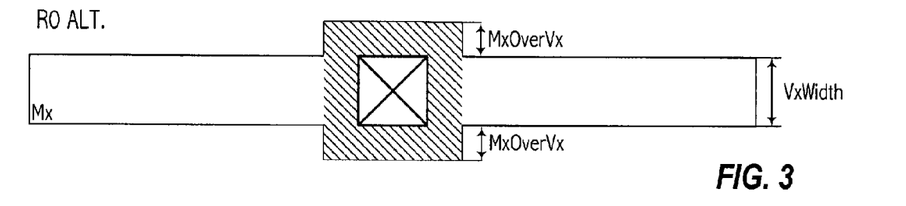

In Region 0, depicted in FIGS. 2 (R0) and 3 (R0 ALT.), not even a single via will fit within the metal line and symmetric enclosures rules must be added, resulting in a bulge or jog in the line as in view 128 of FIG. 1. Mx is less than the sum of the via width plus the symmetric enclosure width "MxOverVx" on both sides (VxWidth+2*MxOverVx), so the metal line must be widened to accommodate a via. Our example line is very long compared to its width, in fact longer than VxWidth+2*MxOverVx, and the design rule is met in that direction.

Figure 4:
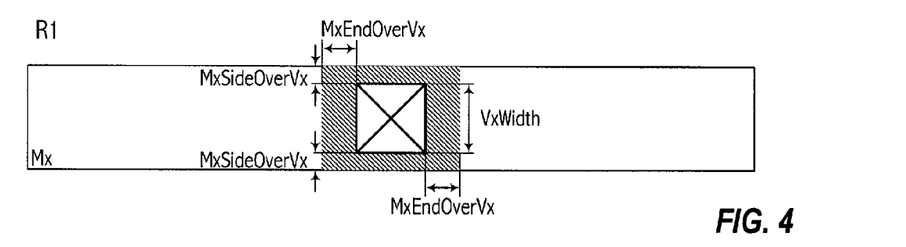

As wider metal line widths are encountered, the Mx enters Region 1, R1 of FIG. 4 when it is just equal to the width of the via plus two normal metal asymmetric side metal enclosures "MxSideOverVx." Asymmetric metal enclosure rules recognize that, from a processing standpoint, having more than the minimum width of enclosure at the end of a rectangular enclosure compensates for and allows the use of a narrower side enclosure, leading to a minimum side enclosure width narrower than the symmetric enclosure minimum width which is, in turn, more narrow than the end enclosure width "MxEndOverVx"

(MxSideOverVx<MxOverVx<MxEndOverVx).

Figure 5:
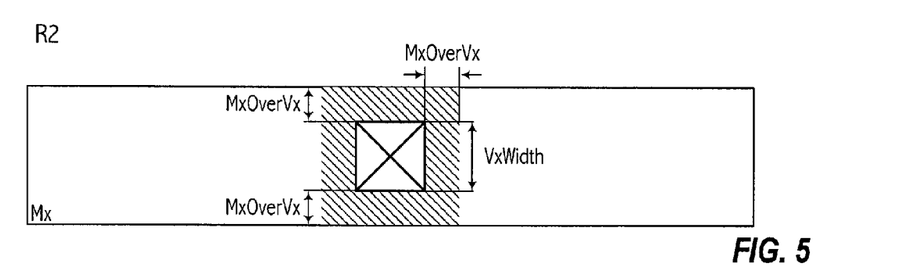
Figure 6:
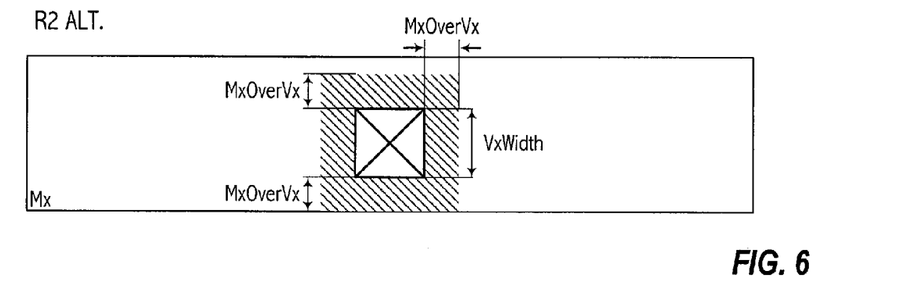
Figure 7:
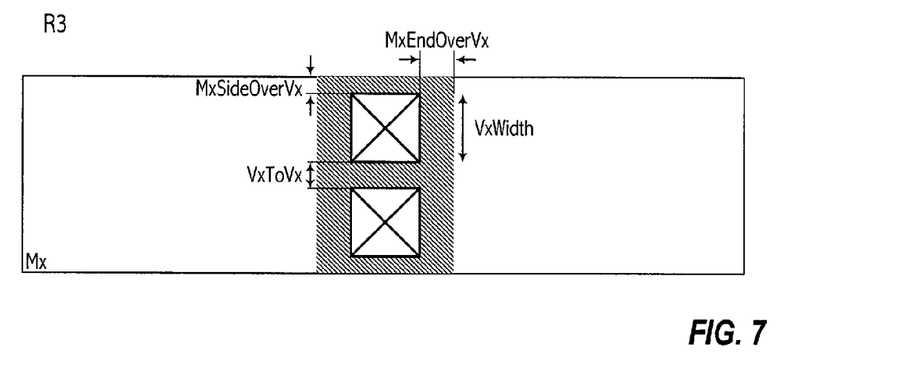

In Region 2, R2 in FIG. 5 and R2 ALT. in FIG. 6, the metal line is large enough to accommodate a single via when symmetric normal metal enclosure rules are imposed. Vias need not be placed centered in a metal feature, as depicted in FIG. 6. FIG. 7 shows a metal feature having the minimum width for Region 3, R3. In this region, two vias can be placed in the metal and still satisfy design rules for metal enclosures and via-to-via spacing "VxToVx." In the example, this minimum width, Mx=VxToVx+2*VxWidth+2*MxSideOverVx, still falls in the range defined as normal metal for this layer.

Figure 8:
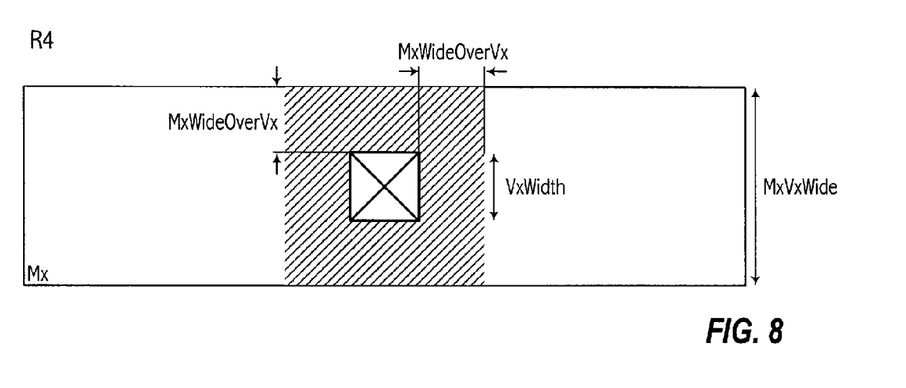

FIG. 8 illustrates via placement under symmetric enclosure rules for wide metal. In Region 4, R4, Mx is at least the width of the via plus two wide symmetric enclosures "MxWideOverVx." This minimum width in a class to hold a via cut is often defined as MxVxWide. A single via can be accommodated under wide-class symmetric enclosure rules in R4.

Figure 9:
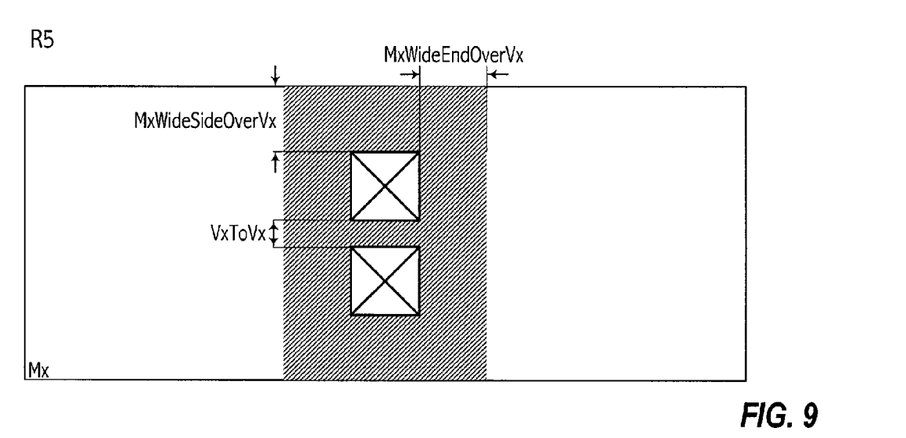
Figure 10:
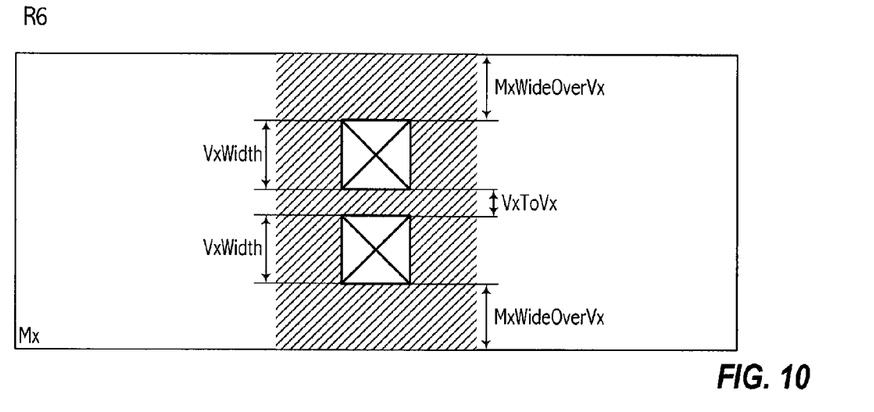

Metal in Region 5, R5 in FIG. 9, can hold two via cuts under asymmetric wide metal enclosure rules. The length of the metal line is long enough to accommodate an enclosure wider than MxWideEndOverVx on each end of the via, so the side enclosure width MxWideSideOverVx can be smaller. In this region the width Mx of the metal is at least equal to twice the via width plus twice the side enclosure width plus the inter-via spacing (Mx=2*VxWidth+2*MxWideSideOverVx+VxToVx). As shown in FIG. 10, two via cuts can be accommodated by metal in Region 6 (R6) using symmetric design rules for wide metal, with a minimum metal enclosure width of MxWideOverVx.

Figure 11:
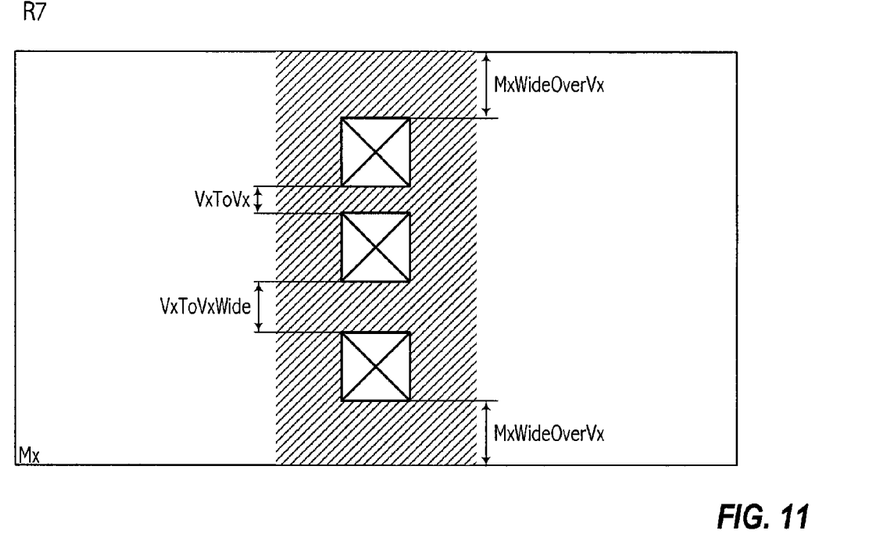

A further constraint when placing vias may be, as in this example, that no more than two vias in a line can be spaced at the minimum via spacing VxToVx; the third must be placed at a distance at least VxToVxWide from the second. This situation is illustrated in FIG. 11. In Region 7 (R7) the metal is wide enough to allow placement of three vias, each having width VxWidth. The minimum metal width for this region is the sum of three times the via width, twice the wide metal symmetric enclosure width, the minimum via-to-via spacing, and the wide via-to-via spacing. In the example of FIG. 11, asymmetric rules do not apply in this region.

Figure 12:
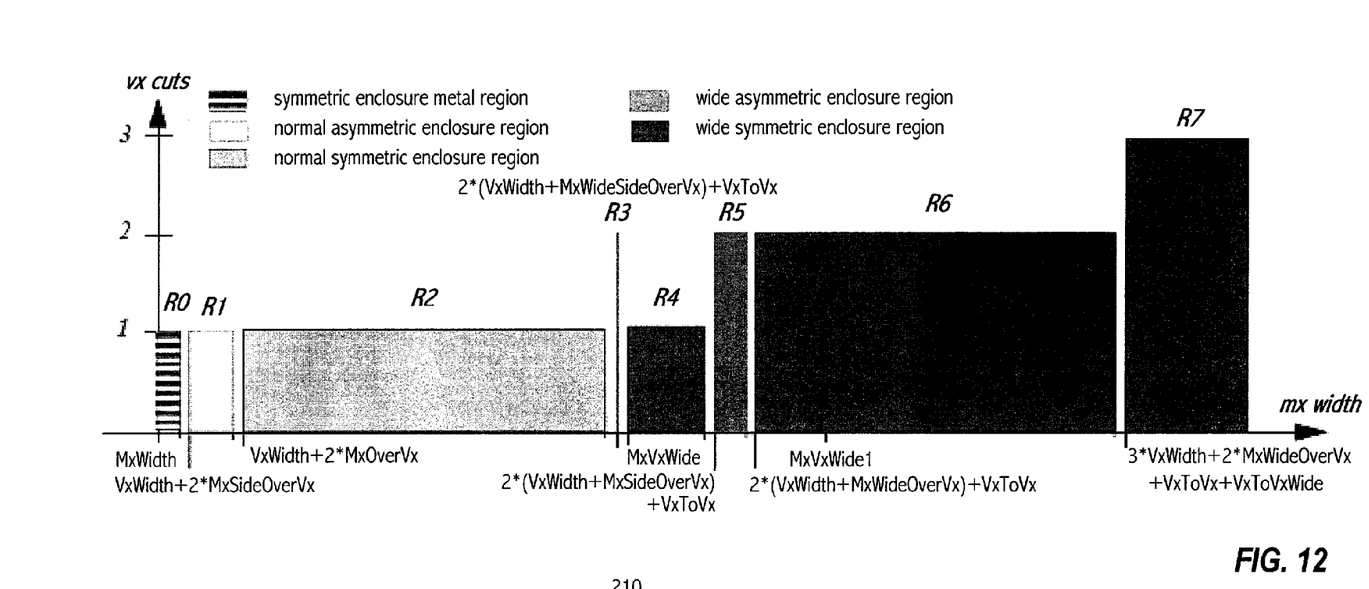
FIG. 12 summarizes the number of via cuts for varying widths of metal for rectangular metal shapes under exemplary design rules.

FIG. 12 summarizes these relationships between metal widths, applicable design rules, and the number of via cuts possible for each region. In some cases on some layers the order of regions may be reversed. Not all regions may be separately encountered in all cases. Some regions may consist of a single width, as shown in the exemplary R3. Nevertheless, for rectangular regions at least, the number of via cuts is a function purely of the width of the metal or other conductor. Using such a mapping it is also possible to determine in which regions more via cuts are possible using asymmetric enclosure rules, regions R1, R3, and R5 in this example, than symmetric rules alone. In other regions it would not be advantageous to try to apply asymmetric rules, risking the possibility of losing fill area in the direction of the end enclosure and generally using more computation time in the attempt.

Figure 13:
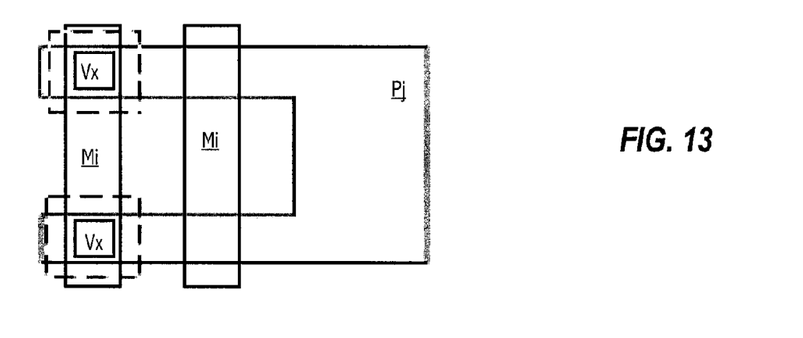
FIG. 13 depicts an example of placement of vias connecting two conductive layers as constrained by different design rules when one of the shapes to be connected is arbitrarily complex.

Strictly speaking this relationship holds only for rectangular shapes, because only for rectangles can two opposite edges be readily identified as "ends" and the other two opposite edges as "sides." However, in a real design, many times the region to be filled with a via or an array of vias may be a non-rectangular polygon, or other irregular shape, as shown in FIG. 13 where the metal feature Pj on layer j is non-rectangular. Some designs even include shapes with angles greater or smaller than 90°. Automatically applying the asymmetric metal enclosure design rules to an arbitrary metal shape to make a design compliant with design for manufacturability principles, i.e. making the design "DFM good," can become a challenge. A reliable method for transforming arbitrarily complex polygons to effective rectangles would help meet this challenge.

Figure 14:
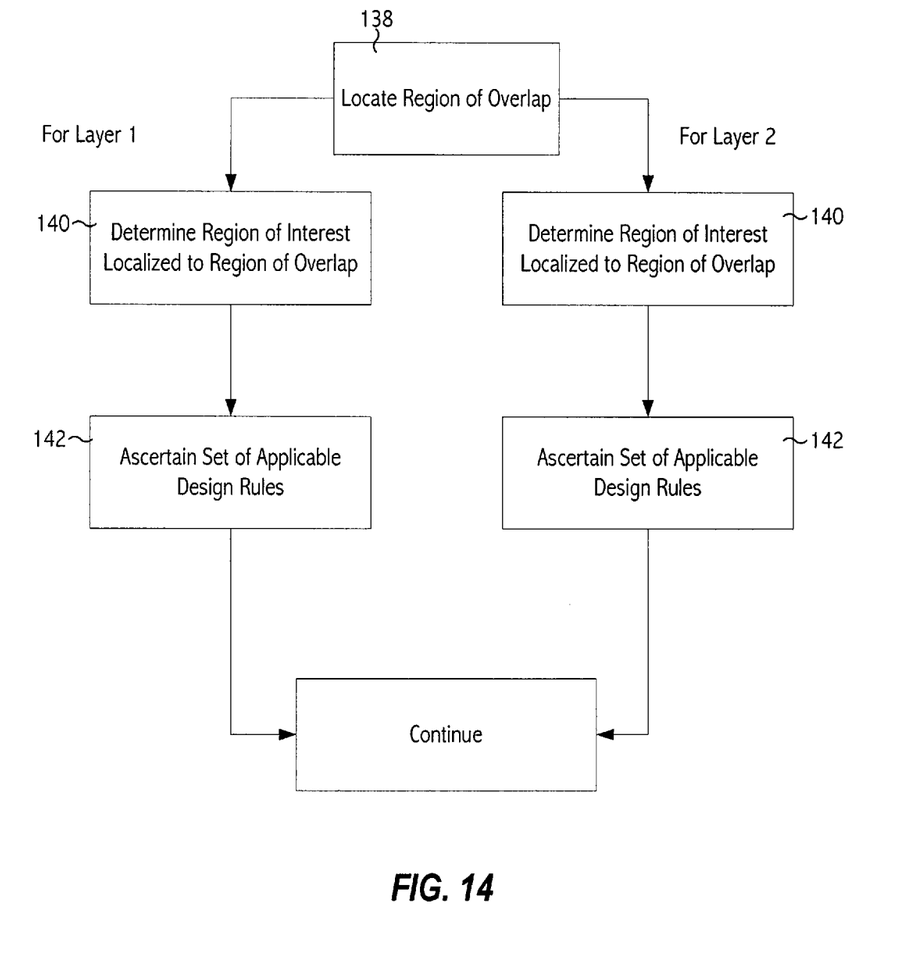
FIG. 14 is a flowchart outlining an approach to applying via metal enclosure rules to overlap regions of arbitrarily complex shape.

Turning again to FIG. 13, one can reformulate the challenge by recognizing that only the part of Pj in the vicinity of the via array Vx will contribute to the enclosure. The challenge therefore becomes one of how to apply the asymmetric metal enclosure design rules to this local part of Pj without losing information about, and particularly the wide metal characteristics of, the larger feature. One approach to tackling this challenge is illustrated in FIG. 14. First a region of overlap is located 138 and this via connection area is used as an anchor for subsequent operations. Taking each layer separately, a region of interest is determined 140, the design rule regime, that is, a set of applicable design rules, for the region of interest is ascertained 142, and those design rules are then used in later steps. In some embodiments individual layer pure fill via areas (PFVAs) are calculated using the design rules, and these are then used to generate the common PFVA. Once a common PFVA has been generated, CAD tools are available to fill the overlap region with one or more vias in an array that conforms to via shape and spacing rules in force.

Figure 15:
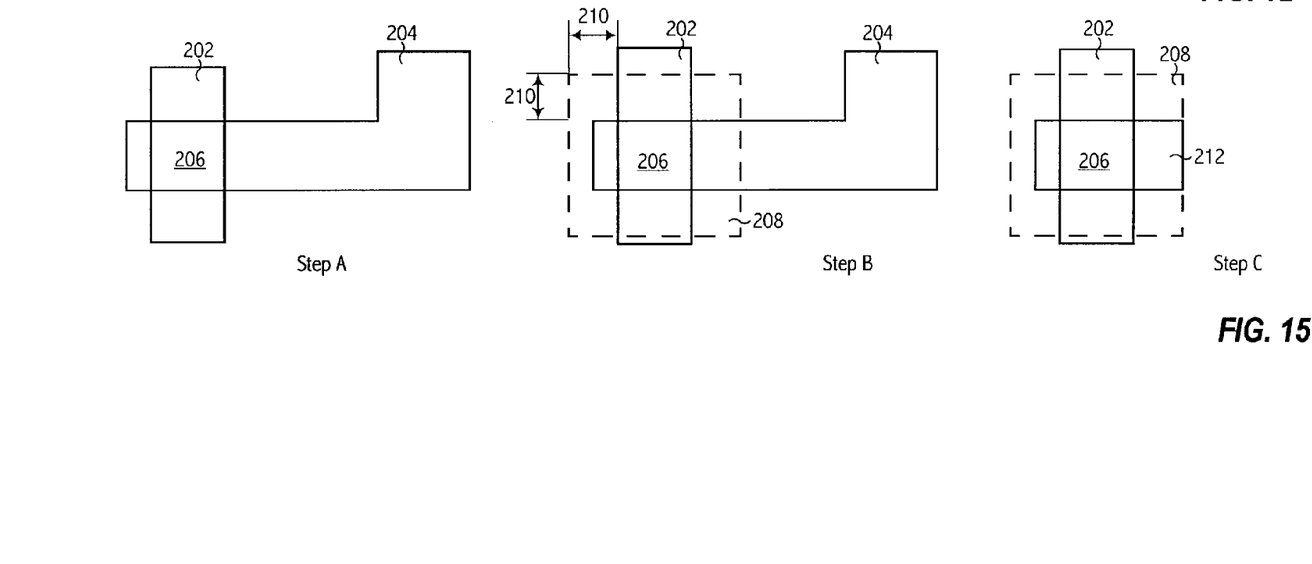
FIG. 15 illustrates an exemplary application of a method of reducing the complexity of an arbitrary shape to aid in application of via enclosure rules.
Figure 16:
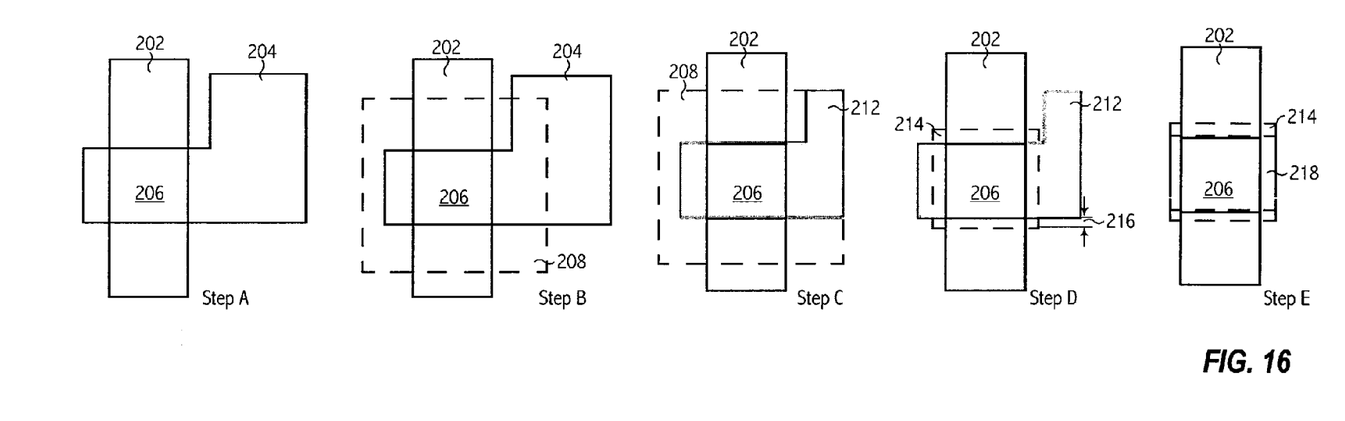
FIG. 16 illustrates an exemplary application of a method of reducing the complexity of an arbitrary shape to aid in application of via enclosure rules.
Figure 17:
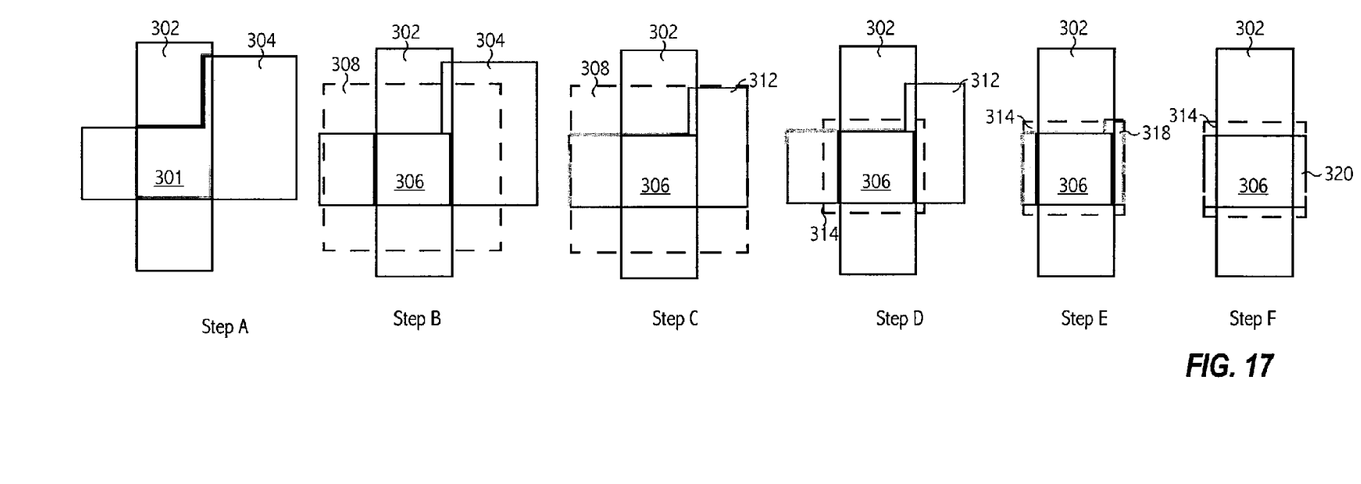
FIG. 17 illustrates an exemplary application of a method of reducing the complexity of an arbitrary shape to aid in application of via enclosure rules.

FIGS. 15, 16, and 17 show exemplary applications of a method for transforming a polygon to an effective rectangle to increasingly complex cases. Steps A, B, and C of FIG. 15 illustrate the method applied to a case of a normal metal line 202 crossing a polygon 204 in an area relatively far removed from non-rectangular portions of the polygon 204, forming a cross area 206. To determine the largest area of possible interest, a halo 208 is formed by adding an amount 210 equal to the width of the widest via metal MiVjWidek to each side of the cross area 206, ensuring that the wide metal characteristics are not lost. The resulting effective shape 212 is the portion of the polygon 204 entirely within the halo 208, obtained by performing a geometrical AND operation on the halo 208 and the polygon 204. In this simplest case, the effective shape 212 is a rectangle.

The situation depicted in FIG. 16 is slightly more complex. After following the same process in Steps A, B and C as for FIG. 15 to derive a halo 208 enclosing the largest area of possible interest an effective shape 212 is again generated by geometrically ANDing the halo 208 and the polygon 204. This time, however, the effective shape 212 is still a polygon. At this point the effective shape 212 can be used to determine the maximum enclosure width MiWideOverVj (or MiWideEndOverVj if asymmetric enclosure rules can be applied) using a SKILL routine CheckWideMetal. A second halo 214 is then generated in Step D by adding this amount 216 to each side of the cross area 206. In this example, the only portion of the polygon 204 that falls within this second, smaller halo 214 is a rectangle 218, as shown in Step E.

In some cases, the cross area 301 itself is not rectangular, as is the case shown in FIG. 17 at Step A. To remove slivers too small to hold via cuts, a size down and size up by half the via width operation is performed. Once the cross area 306 becomes a rectangle (Step B), the procedure is continued as described with reference to Steps B through E of FIG. 17 to generate a second effective shape 318 which, as shown in Step E, remains non-rectangular. Slivers may once more be removed by a size down and size up by half of the via width plus proper side metal enclosure width operation. The effective rectangle 320 results at Step F after the last sliver removal operation. If the effective shape remains non-rectangular, symmetric enclosure rules are applied to form the polygon pure fill via area (PFVA). Refer to U.S. Pat. No. 6,832,360 issued Dec. 14, 2004 to Li, incorporated herein by reference in its entirety, for more information on extraction of PFVA.

Although FIGS. 15, 16, and 17 show the case of a rectangle overlapping a polygon, both metal features may start out as non-rectangular polygons. The polygon transformation may be performed on both layers as required, serially with all steps performed for one layer at a time or in parallel performing only a partial transformation of one layer, performing a partial or complete transformation on the second layer, continuing the transformation on the first layer, etc.

An example of a partial implementation of this procedure in Cadence is shown below. In this example involving vias v1 and v2 there are three wide classes: normal (no suffix), wide (Wide), and wide-one (Wide1). A connection area has been located and defined (cross). Note that for computational efficiency, steps may be performed in an order different from that described with reference to FIGS. 15, 16, and 17. In addition, for clarity the example code addresses a specific case in which the widest class of metal does not support asymmetric enclosures.

```
    ;Use the widest metal definition to set first halo size; for vias v1-v2
there are two wide metal classes
size_f1 = evalstring(sprintf(nil "%s%sWide1" M1 VX))
size_f2 = evalstring(sprintf(nil "%s%sWide1" M2 VX))
;Make use of the cross area boundary box to form the halo boundary. cross_box is
the bounding box of shape cross. A bounding box is a list of coordinates to specify a
rectangle, but it is not a shape. Enlarge the cross bounding box to get the halo
bounding box for mx and mx+1.
m1_box = ExpandABox(cross_box size_f1)
m2_box = ExpandABox(cross_box size_f2)
;Form the working halo shape for mx. ExpandABox is a SKILL procedure to enlarge a
bounding box. To save time, make use of the cross shape, as if using a variable, to
reset the bounding box of cross to form the halo shape, that is, temporarily change
shape cross to a halo shape to obtain the effective mx. This is depicted in Step B of
FIGS. 15, 16, and 17.
cross~>bBox = m1_box
;LeLayerAnd is an Opus SKILL function to find the common parts of the shapes on
two layers. m1ref_lpp is the layer to hold mx, cross_lpp is the layer to hold the halo
shape, and m1wk_lpp is the layer to hold the resultant shapes. This operation is also
called a logical or geometrical AND of the working halo shape and mx whose result is
the effective mx.
m1_wk_l = leLayerAnd(cv m1ref_lpp cross_lpp m1wk_lpp)
m1_wk = car(m1_wk_l) ; The result is a list. Take the first object from the list, even
if the list, as here, only contains one object; see Step C of FIGS. 15, 16, and 17.
;Repeat for mx+1.
cross~>bBox = m2_box
m2_wk_l = leLayerAnd(cv m2ref_lpp cross_lpp m2wk_lpp)
m2_wk = car(m2_wk_l)
;Use the effective metal to find PFVA
m1_pfva = FindLayerPFVA(m1 vx m1_wk); Return mx PFVA shape or coordinates,
depending on whether the input is a rectangle or not
m2_pfva = FindLayerPFVA(m2 vx m2_wk)
```

SKILL procedure FindLayerPFVA is used to find the PFVA for a given effective metal shape, such as m1_wk and m2_wk, for mx and mx+1, respectively. This procedure is appropriate for vias v1-v2 that have two wide metal categories; for other vias, there are other similar procedures, to account for their different wide metal categories.

```
procedure(FindLayerPFVA(mx vx mx_eff)
  prog((MX VX type mx_w_f raw_dir wmov mx_eff_l mwidth dir
    asym3 asym31 asym2 endov sideov mx_pfva_box asym1 asym11
    mx_pfva_box mx_pfva mov mw mvwide)
    MX = upperCase(mx)
    VX = upperCase(vx)
;Use the effective metal to determine the wide metal characteristics. In the v1-v2
category, there are w0, w1, and w2 classes, and the return value mx_w_f will be 0, 1,
or 2 respectively. Also returned is the raw direction which relies purely on the shape
dimension, not on its relationship with the other layer. An advantage of determining
the direction of the shape at this time is that the first effective metal shape is relatively
large and the direction may in some cases be determined more accurately using larger
rather than smaller shapes. This direction may also be used when the a direction
cannot be determined by the relationship between layers.
    mx_w_f = CheckWideMetal(mx_eff mx vx)
    raw_dir = cadr(mx_w_f)
    mx_w_f = car(mx_w_f)
;The widest metal enclosure amount may be used as the secondary halo size; it is very
small compared to the wide metal definition. Use the SKILL program to construct the
technology parameter and use SKILL function evalstring to get its value.
    wmov = evalstring(sprintf(nil "%sWide1Over%s" MX VX))
    if(mx_w_f == 2 then
;In this example the w2 metal does not support asymmetric enclosure rules, so the
PFVA is obtained directly by sizing down the effective metal by the wide metal
enclosure amount
      if(rect_flag then
; For a rectangle, just size down the bounding box coordinates to save computation
time.
        mx_pfva_box = ExpandABox(mx_eff~>bBox -wmov)
        return(mx_pfva_box)
```

```
; Return the box coordinates for a rectangle.
    else
; For a polygon, use SKILL function leLayerSize to size down the necessary
amount. This function sizes all the shapes on the input layer, where effective metal
mx_eff resides, and puts the resultant shapes on layer wk_lpp2.
        mx_pvfa_l = leLayerSize(wk_cv mx_eff~>lpp –wmov wk_lpp2)
        mx_pfva = car(mx_pvfa_l); Get the resultant shape from the list.
        return(mx_pfva)
; Return resultant shape for a polygon.
    )
)
;The w1 and w0 metal classes do support both symmetric and asymmetric enclosure
rules, so the effective metal does need to be narrowed down if it is a polygon.
    if(mx_eff~>objType != "rect" then
; The effective metal is a polygon.
;Set a new halo size; since the end enclosure is bigger than the side enclosure, set the
halo size equal to the end enclosure to make sure asymmetric enclosures can be used
        if(mx_w_f == 0 then
            wmov = evalstring(sprintf(nil "%sEndOver%s" MX VX))
        else
            wmov = evalstring(sprintf(nil "%sWideEndOver%s" MX VX))
        )
;Use the cross shape to create a halo, as shown in FIGS. 16 and 17. The halo shape
is on layer wk_lpp2
        leLayerSize(wk_cv cross_lpp wmov wk_lpp2)
;Use the logical AND to get the secondary effective metal 218, smaller than the first
effective metal 212, as shown in FIG. 16. The resultant shapes are on layer wk_lpp3.
The AND operates on halo layer wk_lpp2 and the layer housing the first effective
metal.
        mx_eff_l = leLayerAnd(wk_cv wk_lpp2 mx_eff~>lpp wk_lpp3)
        mx_eff = car(mx_eff_l)
        if(mx_eff~>objType == "polygon" then
;If the secondary effective metal 318 is still a polygon, as shown in FIG. 17, try to cut
off slivers, using the minimum metal width that can hold a via as the minimum width.
            if(mx_w_f == 0 then
                str = sprintf(nil "%sWidth+%sSideOver%s*2" VX MX VX)
            else
                str = sprintf(nil "%sWidth+%sWideSideOver%s*2" VX MX VX)
            )
;The size factor is set a little bit smaller than half of the minimum width, so the metal
of the exact minimum width will be left over. Here the minimum increment of width
is Grid, so a tolerance factor can be set at a tenth that value, or TenthGrid.
            size_f = evalstring(str)/2 – 2*TenthGrid
;Size down by the sizing factor.
            mx_eff_l = leLayerSize(wk_cv wk_lpp3 –size_f wk_lpp0)
            mx_eff = car(mx_eff_l)
            if(!mx_eff then return(nil))
;If there is no shape left over in the result list, that implies that the shape width is
smaller than the minimum metal width to hold a via, so return nil to tell the program
that there will not be a PFVA.
;Size up the same amount to eliminate slivers that are narrower than the minimum
width, as shown in FIG. 17
            mx_eff_l = leLayerSize(wk_cv wk_lpp0 size_f wk_lpp1)
            mx_eff = car(mx_eff_l)
; Get the resultant shape 320, as shown in FIG. 17.
;If the secondary effective metal shape is still a polygon, apply the symmetric
enclosure size down to form the polygon PFVA, and return
        )
    )
;In all other cases, the effective metal as shown in FIGS. 16 and 17. Apply
asymmetric or symmetric enclosure rules depending on metal width, as usual.
        :
    )
)
```

Those skilled in the art of computational performance enhancement may have recognized in the foregoing code snippet(s) several uses of special cases rather than the most general ones. In certain applications of the invention it may be advantageous to treat rectangles that can be completely defined by two opposite coordinate pairs differently than other polygons, rectangles need not be treated so specially to beneficially practice the invention. In other words, at its most basic, a rectangle remains a four-sided figure with opposite pairs of parallel sides, one pair generally longer than the other, and four 90° interior angles at the corners. Whether a non-human processor represents this as a pair of corner coordinates, a larger number of coordinates, or a more complex conglomeration of attributes is immaterial to its nature, if not to computational efficiency.

Once a rectangle is obtained, either as an original feature or through transformation of a non-rectangular polygon, the applicable enclosure rules must be determined in order to form the PFVA for the layer. The width of a rectangle is the distance between the two most closely spaced opposite sides, while its length is the distance between the other pair of opposite sides. The direction of a rectangle is defined along its length. In the special case of a square, that is, a rectangle whose length and width are equal, the direction may be defined for maximum convenience.

Figure 18:
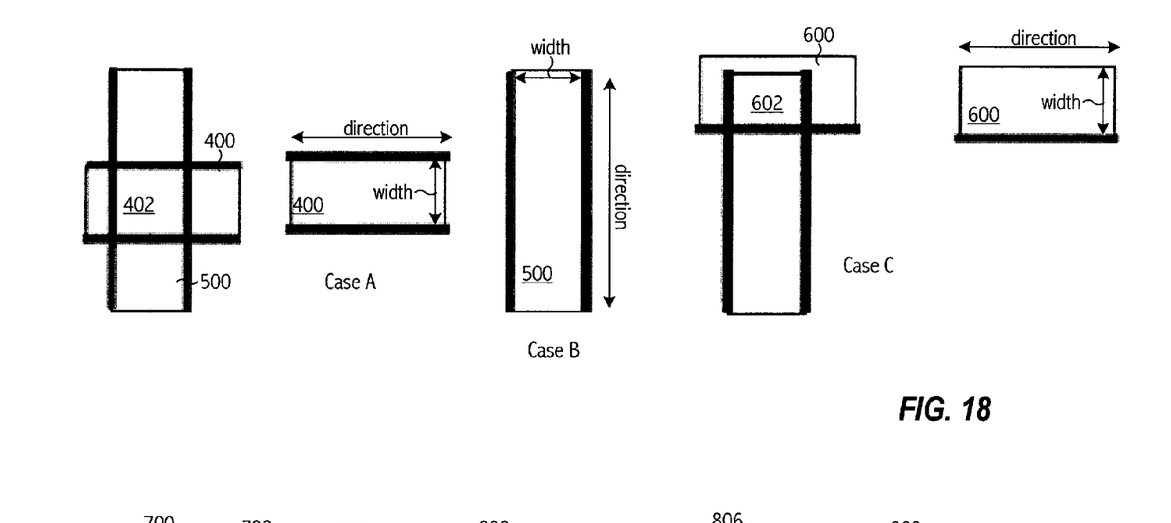
FIG. 18 illustrates a method for ascertaining the width and direction of a shape.

The orientation of an effective rectangle 400, 500, may be determined as depicted in FIG. 18, Cases A, B, and C. If two opposite sides of an effective rectangle 400, 500, bound the cross area 402 as in FIG. 18 Cases A and B (or the rectangular cross area 306 of FIG. 17), the side enclosure may be applied at those sides and the end enclosure applied in the direction at right angles thereto. In FIG. 18 Case A the bounding opposite sides of effective rectangle 400 are designated the "top" and "bottom," its width is defined as the distance between the top and bottom, the side enclosure is applied in the vertical direction, and the end enclosure is applied in the horizontal direction. In FIG. 18 Case B the bounding opposite sides of effective rectangle 500 are designated the "left" and "right," its width is defined as the distance between the right and left sides, the side enclosure is applied in the horizontal direction, and the end enclosure is applied in the vertical direction. If two opposites sides of an effective rectangle 600 do not bound the rectangular cross area 602 as in FIG. 18 Case C, the width and length of the first effective shape generated (212 in FIGS. 15 and 16, 312 in FIG. 17, e.g.) are used to determine enclosure placement, with the end enclosure applied in the longer direction, which is then defined as the direction of the effective shape.

Figure 19:
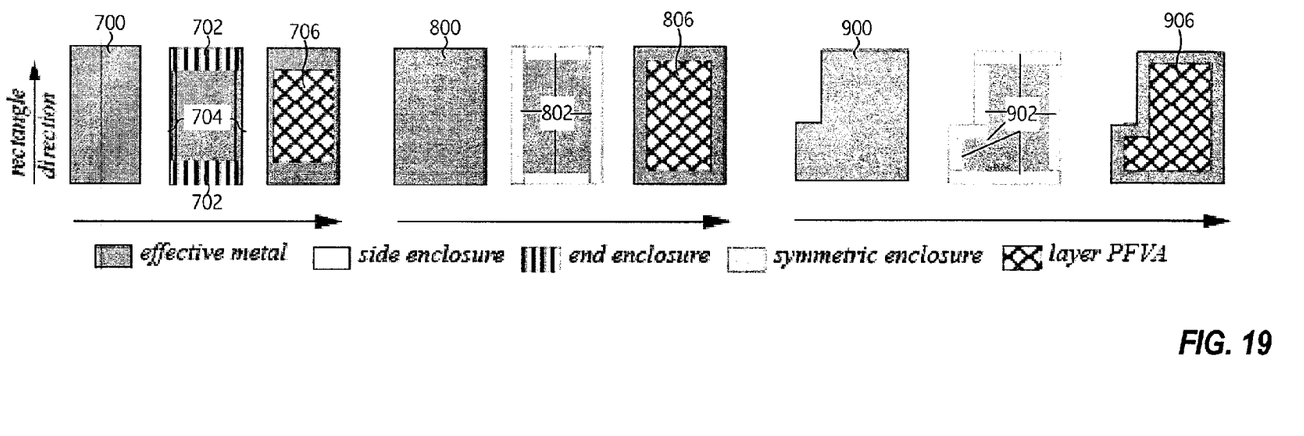
FIG. 19 depicts the application of enclosure rules to effective shapes under different sets of via enclosure rules.

Turning to FIG. 19, one can see how the enclosure rules are applied to different shapes. In the first case the effective metal 700 is a rectangle in a region where asymmetric enclosure rules can be applied. End enclosure amount 702 is excluded from the ends of the effective rectangle and side enclosure amount 704 is excluded from the sides along the direction of effective rectangle 700 to form the layer PFVA 706. In the second example the effective metal 800 is again rectangular, but this time it lies in a region where symmetric enclosure rules should be applied. The symmetric enclosure amount 802 is excluded from the entire perimeter of effective rectangle 800 to obtain layer PFVA 806. For effective metal 900, either attempts to transform it into an effective rectangle were unsuccessful or it lay in a region where it would not have been advantageous to try. In either event, symmetric enclosure rules apply and the effective metal 900 area is shrunk by an appropriate symmetric enclosure amount 902 at all sides to obtain the layer PFVA 906.

Although the above embodiments have been described in relation to Cadence EDA tools and SKILL language code, the techniques described herein can be applicable to and make use of any EDA tools, electronic circuit layout, and implemented in any code language.

Although the above embodiments have been described in relation to integrated circuit layouts, the techniques described herein can be equally useful in the layout of other electronic devices, for example in a layout of a printed wiring board.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow.

Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method for use in connection with a design layout of an electronic circuit, said design layout comprising a plurality of respective features on each of a plurality of layers, said method comprising the steps of:
    locating a region of overlap between first and second features on respective first and second layers; and
    for each feature:
        determining a region of interest, said region of interest containing the region of overlap;
        ascertaining a set of via enclosure rules applicable within the region of interest and
        determining whether asymmetric via enclosure rules may be applied for the feature in the region of interest.

2. The method of claim 1, wherein determining the region of interest for each feature comprises:
    defining a localized region around the region of overlap.

3. The method of claim 2, wherein defining the localized region comprises:
    defining a bounding box having a vertical extent and a horizontal extent, said vertical extent equal to the sum of the width of the region of overlap and twice the minimum dimension required to hold a via cut in the vertical direction;
    said horizontal extent equal to the sum of the length of the region of overlap and twice the minimum dimension required to hold a via cut in the horizontal direction; and
    centering a halo vertically and horizontally on the effective cross area.

4. The method of claim 2, further comprising:
    generating an effective shape as the result of a geometrical AND operation on the feature and its region of interest.

5. The method of claim 4, comprising redefining the region of interest based on a property of the effective shape.

6. The method of claim 1, wherein ascertaining the set of via enclosure rules applicable within the region of interest for the feature comprises:
    determining that asymmetric via enclosure rules may not be applied for the feature in the region of interest.

7. The method of claim 6, further comprising:
    assigning to the feature a wide class; and
    specifying a symmetric enclosure amount required to be applied in all directions.

8. The method of claim 1, further comprising:
    filling the region of overlap with an array of vias in accordance with the via enclosure rules applicable for each feature.

9. The method of claim 8, wherein accordance with applicable enclosure rules is ensured by:
    excluding from a perimeter of the region of overlap an amount at least equal to that specified by the applicable enclosure rules.

10. The method of claim 1, wherein ascertaining the set of via enclosure rules applicable within the region of interest for the feature comprises:
    determining that asymmetric via enclosure rules may be applied for the feature in the region of interest.

11. The method of claim 10, further comprising:
    assigning to the feature a wide class, a width, and a direction;

specifying a side enclosure amount required to be applied at the feature's width; and specifying an end enclosure amount required to be applied in the feature's direction.

12. The method of claim 11, wherein the assigning of a width comprises:

transforming the feature into an effective rectangle, said effective rectangle having a width, a length, and two pairs of opposite sides; and determining the width of the effective rectangle as the distance between the most closely spaced of the two pairs of opposite sides.

13. The method of claim 12, wherein the transforming the feature into an effective rectangle comprises:

defining an effective cross area for the region of overlap, the effective cross area having a width and a length;

defining a halo having a vertical extent and a horizontal extent, said vertical extent equal to the sum of the width of the effective cross area and twice the minimum dimension required to hold a via cut;

said horizontal extent equal to the sum of the length of the effective cross area and twice the minimum dimension required to hold a via cut;

centering the halo vertically and horizontally on the effective cross area; and excluding portions of the feature not contained within the halo to form an effective polygon.

14. The method of claim 13, wherein the effective polygon is the effective rectangle.

15. The method of claim 13, wherein defining the effective cross area includes:

excluding from the effective cross area perimeter portions of the region of overlap insufficiently large to hold a via cut.

16. The method of claim 13, further comprising:

defining a second halo having a vertical extent and a horizontal extent, said vertical extent equal to the sum of the width of the effective cross area and twice the minimum required via enclosure in the vertical direction;

said horizontal extent equal to the sum of the length of the effective cross area and twice the minimum required via enclosure in the horizontal direction;

centering the second halo vertically and horizontally on the effective cross area; and excluding portions of the feature not contained within the second halo to form a second effective polygon.

17. The method of claim 16, wherein the second effective polygon is the effective rectangle.

18. The method of claim 16, further comprising: excluding from the second effective polygon portions insufficiently large to hold a via cut.

19. A computer readable storage medium including computer program code that when executed cause a computer to perform the method comprising the steps of:

locating a region of overlap between first and second features on respective first and second layers; and for each feature:

determining a region of interest, said region of interest containing the region of overlap;

ascertaining a set of via enclosure rules applicable within the region of interest; and determining whether asymmetric via enclosure rules may be aDDlied for the feature in the region of interest.

20. An electronic circuit fabricated from a design layout representation thereof, said design layout being generated by the steps of:

locating a region of overlap between first and second features on respective first and second layers; and for each feature:

determining a region of interest, said region of interest containing the region of overlap; of overlap;

ascertaining a set of via enclosure rules applicable within the region of interest; and determining whether asymmetric via enclosure rules may be aDDlied for the feature in the region of interest.

* * * * *

UNITED STATES PATENT AND TRADEMARK OFFICE
CERTIFICATE OF CORRECTION

PATENT NO. : 7,519,929 B2  
APPLICATION NO. : 11/426223  
DATED : April 14, 2009  
INVENTOR(S) : Mu-Jing Li Page 1 of 1

It is certified that error appears in the above-identified patent and that said Letters Patent is hereby corrected as shown below:

In column 14, at line 24, delete "aDDlied" and replace with --applied--.

In column 14, at line 36, delete "aDDlied" and replace with --applied--.

Signed and Sealed this

Twenty-third Day of June, 2009

JOHN DOLL  
*Acting Director of the United States Patent and Trademark Office*